(12) United States Patent
Kagawa et al.

(10) Patent No.: US 11,742,179 B2
(45) Date of Patent: Aug. 29, 2023

(54) PROXIMITY EFFECT CORRECTING METHOD, MASTER PLATE MANUFACTURING METHOD, AND DRAWING APPARATUS

(71) Applicant: Kioxia Corporation, Tokyo (JP)

(72) Inventors: Yoshinori Kagawa, Shinagawa Tokyo (JP); Shunko Magoshi, Minato Tokyo (JP)

(73) Assignee: Kioxia Corporation, Tokyo (JP)

( * ) Notice: Subject to any disclaimer, the term of this patent is extended or adjusted under 35 U.S.C. 154(b) by 45 days.

(21) Appl. No.: 17/474,926

(22) Filed: Sep. 14, 2021

(65) Prior Publication Data

US 2022/0238303 A1    Jul. 28, 2022

(30) Foreign Application Priority Data

Jan. 26, 2021  (JP) ................... 2021-010415

(51) Int. Cl.
*H01J 37/317* (2006.01)
*H01J 37/302* (2006.01)

(52) U.S. Cl.
CPC ...... *H01J 37/3175* (2013.01); *H01J 37/3026* (2013.01); *H01J 2237/31754* (2013.01); *H01J 2237/31769* (2013.01)

(58) Field of Classification Search
CPC ............... H01J 37/3026; H01J 37/3175; H01J 37/3177; H01J 2237/31754; H01J 2237/31769
See application file for complete search history.

(56) References Cited

U.S. PATENT DOCUMENTS

| 6,316,163 | B1 | 11/2001 | Magoshi et al. |
| 6,501,083 | B1* | 12/2002 | Kamijo .............. G03F 1/20 |
| | | | 430/311 |
| 11,243,473 | B2 | 2/2022 | Wang et al. |
| 2004/0075064 | A1* | 4/2004 | Magoshi .......... H01J 37/3175 |
| | | | 430/296 |
| 2021/0240074 | A1* | 8/2021 | Spengler ............... G03F 1/74 |

FOREIGN PATENT DOCUMENTS

| CN | 110709779 A | | 1/2020 |
| JP | H1-111326 A | | 4/1989 |
| JP | H6-5501 A | | 1/1994 |
| JP | H10-64791 A | | 3/1998 |
| JP | 3350416 B2 | | 11/2002 |
| JP | 2013183048 A | * | 9/2013 |
| JP | 2020-27866 A | | 2/2020 |
| TW | 201245897 A1 | | 11/2012 |

* cited by examiner

*Primary Examiner* — David E Smith
(74) *Attorney, Agent, or Firm* — Finnegan, Henderson, Farabow, Garrett & Dunner, LLP

(57) ABSTRACT

According to one embodiment, a proximity effect correcting method includes acquiring drawing information for drawing a pattern on a substrate with irradiation of an electron beam. The method further includes acquiring surface profile information related to a surface profile of the substrate. The method further includes calculating an energy distribution of a backscattered beam to be produced by backscattering of the electron beam in the substrate on a basis of the acquired drawing information and surface profile information. The method further includes calculating a required energy amount of the electron beam on a basis of the calculated energy distribution.

12 Claims, 14 Drawing Sheets

INCLINATION ANGLE INFORMATION AND
INCLINATION DIRECTION INFORMATION: S5

| SLOPE PORTION | INCLINATION ANGLE θ [deg] | INCLINATION DIRECTION [deg] |
|---|---|---|
| a | 3 | 0 |
| b | 3 | 90 |
| c | 3 | 270 |
| d | 3 | 180 |

CALCULATE ENERGY DISTRIBUTION OF
BACKSCATTERED BEAM IN SLOPE PORTION: S6

CALCULATE INTEGRATED ENERGY DISTRIBUTION: S7

CALCULATE REQUIRED ENERGY AMOUNT: S8

CALCULATE INCLINATION ANGLE AND INCLINATION DIRECTION: S9

CALCULATE INTEGRATED ENERGY DISTRIBUTION (FLAT PORTION): S7

| 0 | 0.1 | 0.1 | 0.3 | 0.1 | 0.1 | 0 |
|---|---|---|---|---|---|---|
| 0.1 | 0.5 | 0.7 | 0.9 | 0.7 | 0.5 | 0.1 |
| 0.3 | 0.6 | 1 | 1 | 1 | 0.9 | 0.3 |
| 0.3 | 0.7 | 1 | 1 | 1 | 0.9 | 0.3 |
| 0.3 | 0.6 | 1 | 1 | 1 | 0.9 | 0.3 |
| 0.1 | 0.5 | 0.9 | 1 | 0.9 | 0.5 | 0.1 |
| 0 | 0.3 | 0.6 | 0.6 | 0.6 | 0.3 | 0 |

PROXIMITY EFFECT CORRECTING METHOD, MASTER PLATE MANUFACTURING METHOD, AND DRAWING APPARATUS

CROSS REFERENCE TO RELATED APPLICATIONS

This application is based upon and claims the benefit of priority from the prior Japanese Patent Application No. 2021-10415, filed on Jan. 26, 2021, the entire contents of which are incorporated herein by reference.

FIELD

Embodiments of the present invention relate to a proximity effect correcting method, a master plate manufacturing method, and a drawing apparatus.

BACKGROUND

A master plate for a semiconductor process is sometimes created using an electron beam lithography apparatus. In this case, it may be difficult to appropriately correct the proximity effect due to backscattering of an electron beam in a substrate for the master plate depending on surface profiles of the substrate.

BRIEF DESCRIPTION OF THE DRAWINGS

FIG. 15 is an explanatory diagram for explaining an example of a calculating process of the integrated energy distribution in the flat portion illustrated in the flowchart of FIG. 3.

DETAILED DESCRIPTION

Figure 1A:
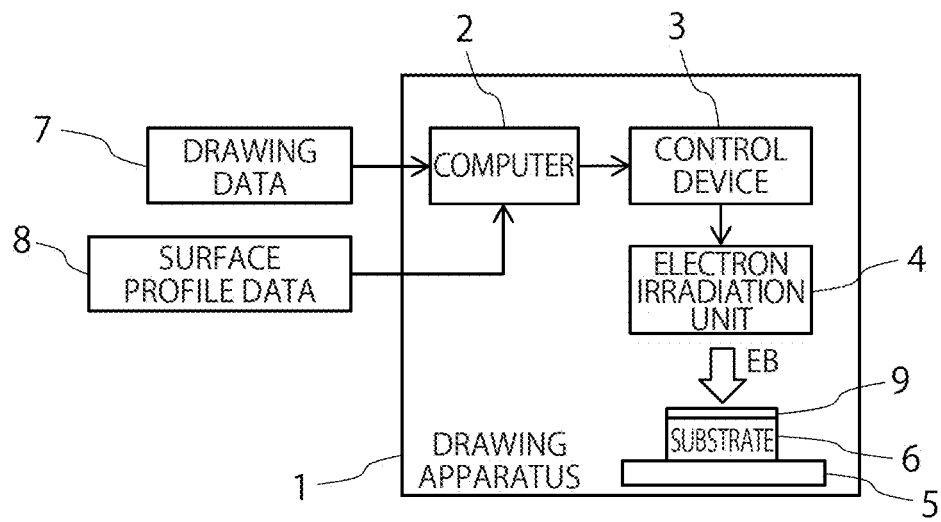
FIG. 1A is a diagram illustrating an example of a drawing apparatus according to an embodiment.

According to one embodiment, a proximity effect correcting method includes acquiring drawing information for drawing a pattern on a substrate with irradiation of an electron beam. The method further includes acquiring surface profile information related to a surface profile of the substrate. The method further includes calculating an energy distribution of a backscattered beam to be produced by backscattering of the electron beam in the substrate on a basis of the acquired drawing information and surface profile information. The method further includes calculating a required energy amount of the electron beam on a basis of the calculated energy distribution.

Embodiments of the present invention will be explained below with reference to the drawings. In FIG. 1A to 17E, same or identical constituent elements are denoted by like reference characters and redundant explanations thereof are omitted.

(Drawing Apparatus)

Figure 1B:
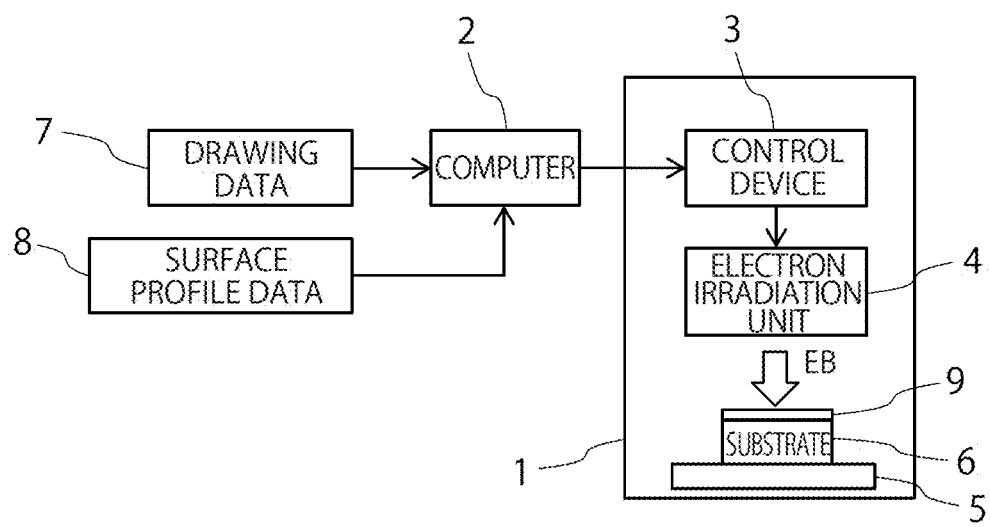
FIG. 1B is a diagram illustrating another example of the drawing apparatus according to the embodiment.

FIG. 1A is a diagram illustrating an example of a drawing apparatus 1 according to an embodiment. FIG. 1B is a diagram illustrating another example of the drawing apparatus 1 according to the embodiment. The drawing apparatuses 1 illustrated in FIGS. 1A and 1B can be used, for example, to draw a pattern on a substrate 6 described later (that is, a resist film 9 on the substrate 6) with irradiation of an electron beam EB at the time of manufacturing a master plate to be used in a semiconductor process. Specific modes of the substrate 6 are not particularly limited as long as the substrate 6 is applicable to manufacturing of a master plate with irradiation of the electron beam EB. For example, the substrate 6 may be a mask blank 6A or 6C or a template blank 6B as will be described later with reference to FIGS. 2A to 2C. More specifically, the drawing apparatuses 1 illustrated in FIGS. 1A and 1B can be used to appropriately correct the proximity effect produced by backscattering in consideration of the fact that the accumulated energy distribution in the resist film 9 due to a backscattered beam (hereinafter, "energy distribution of backscattered beam") differs depending on differences in the surface profile of the substrate 6.

The drawing apparatus 1 illustrated in FIG. 1A includes a computer 2, a control device 3, an electron irradiation unit 4, and a stage 5. The computer 2 performs various types of computing processing (for example, calculation of an energy distribution of the backscattered beam and calculation of a required energy amount described later) in proximity effect correction. In FIG. 1A, the computer 2 may further perform computing processing for drawing other than the proximity effect correction.

In the drawing apparatus 1 illustrated in FIG. 1B, the computer 2 is placed outside the drawing apparatus 1. In FIG. 1B, the computer 2 outside the drawing apparatus 1 performs various types of computing processing in the proximity effect correction and the drawing apparatus 1 may separately include a computer (not illustrated) that performs computing processing for drawing other than the proximity effect correction.

The following explanations of the drawing apparatus 1 are explanations common to the drawing apparatuses 1 illustrated in FIGS. 1A and 1B unless otherwise specified. The electron irradiation unit 4 is placed in an electron optical lens barrel (not illustrated). The substrate 6 is mounted on the stage 5 in a vacuum chamber communicated with the electron optical lens barrel. The stage 5 can be moved by a driving device such as a motor, for example, in a horizontal direction (an X direction and a Y direction) and a vertical direction (a Z direction). The irradiation location of the election beam EB with respect to the substrate 6 on the stage 5 can be changed with movement of the stage 5.

Figure 2A:
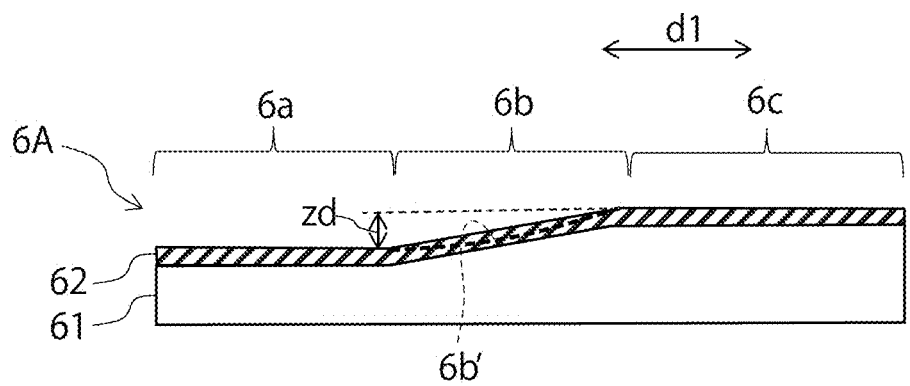
FIG. 2A is a sectional view illustrating an example of a mask blank to which the drawing apparatus according to the embodiment is applicable.
Figure 2B:
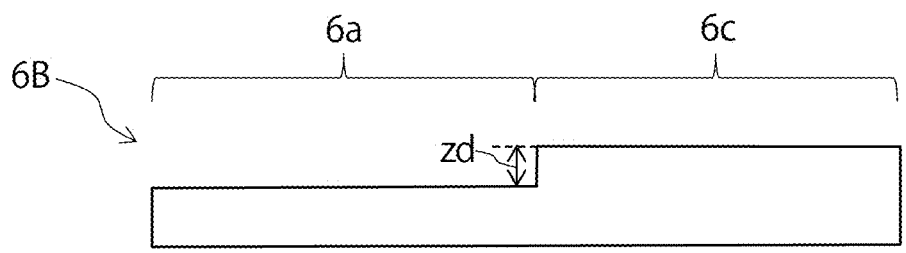
FIG. 2B is a sectional view illustrating an example of a template blank to which the drawing apparatus according to the embodiment is applicable.
Figure 2C:
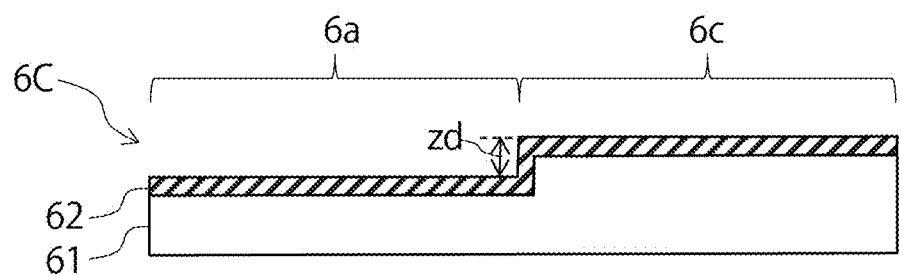
FIG. 2C is a sectional view illustrating another example of the mask blank to which the drawing apparatus according to the embodiment is applicable.

Before the constituent parts of the drawing apparatus 1 are described in more detail, examples of the substrate 6 to which the drawing apparatus 1 is applicable are explained below. FIG. 2A is a sectional view illustrating an example of the mask blank 6A to which the drawing apparatus 1 according to the embodiment is applicable. FIG. 2B is a sectional view illustrating an example of the template blank 6B to which the drawing apparatus 1 according to the embodiment is applicable. FIG. 2C is a sectional view illustrating another example of the mask blank 6C to which the drawing apparatus 1 according to the embodiment is applicable. The mask blanks 6A and 6C are examples of the substrate 6 used in manufacturing of a photomask being a master plate for photolithography. The template blank 6B is an example of the substrate 6 used in manufacturing of a template being a master plate for nanoimprint lithography.

As illustrated in FIGS. 2A and 2C, each of the mask blanks 6A and 6C as the substrate 6 includes a translucent substrate 61, and a light shielding film 62 formed on the translucent substrate 61. The translucent substrate 61 may include, for example, quartz as a principal component. The light shielding film 62 may include, for example, a metal such as chrome (Cr) as a principal component. Meanwhile, the template blank 6B as the substrate 6 includes, for example, quartz as a principal component, thereby having a translucency as a whole as illustrated in FIG. 2B.

When there is a level difference or a slope on the surface of a processing target film formed on a device substrate (a wafer) for a semiconductor device, it is difficult to process the processing target film with a high accuracy in a case in which a photomask or a template having a uniformly flat surface is used. Specifically, in the case of photolithography using a photomask, it is difficult to focus exposure light onto a resist film on the processing target film, so that appropriately exposing the resist film on the processing target film to light becomes difficult. In the case of nanoimprint lithography using a template, it is difficult to transfer a pattern to a resist on a device substrate being a processing target film while appropriately pressing the template against the resist. As a result, formation of a circuit pattern on the processing target film with a desired accuracy becomes difficult. Therefore, with an objective of processing a processing target film including a level difference or a slope with a high accuracy, each of the surfaces of the substrates 6A to 6C for a photomask or a template has a surface profile matching the surface profile of the processing target film. Specifically, the surface of the mask blank 6A illustrated in FIG. 2A has a flat portion 6a parallel to an in-plane direction d1, a flat portion 6c formed to be higher than the flat portion 6a by a level difference zd, and a slope portion 6b connecting the flat portions 6a and 6c. When the mask blank 6A is mounted on the stage 5, the in-plane direction d1 corresponds to the horizontal direction. While the slope portion 6b illustrated in FIG. 2A is a linearly inclined plane, a slope portion 6b' may be an inclined curved plane as indicated by sign 6b' in FIG. 2A. Each of the surfaces of the template blank 6B illustrated in FIG. 2B and the mask blank 6C illustrated in FIG. 2C has flat portions 6a and 6c adjacent to each other and formed to have different heights by the level difference zd. The template blank 6B may have a slope portion.

Figure 16A:
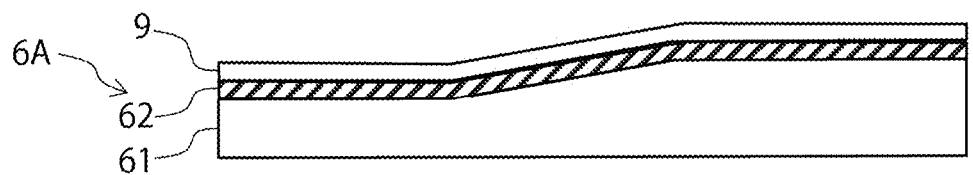
FIG. 16A is a sectional view illustrating a manufacturing method of a photomask according to the embodiment.
Figure 17A:
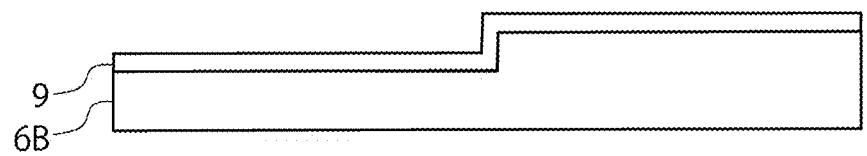
FIG. 17A is a sectional view illustrating a manufacturing method of a template according to the embodiment.
Figure 17B:
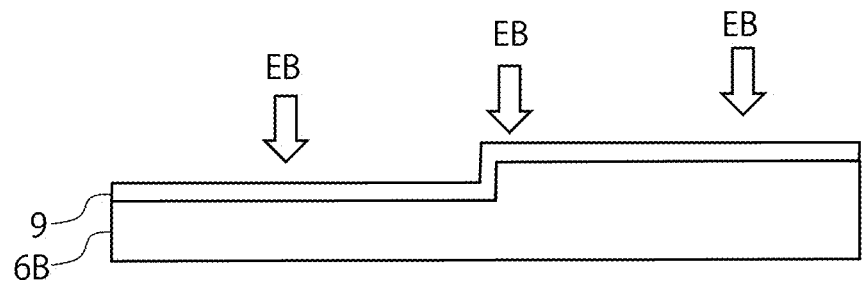
FIG. 17B is a sectional view illustrating the manufacturing method of a template according to the embodiment, in continuation from FIG. 17A.
Figure 17C:
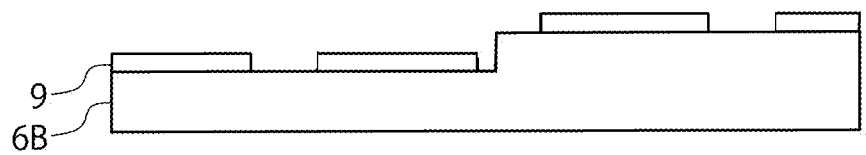
FIG. 17C is a sectional view illustrating the manufacturing method of a template according to the embodiment, in continuation from FIG. 17B.
Figure 17D:
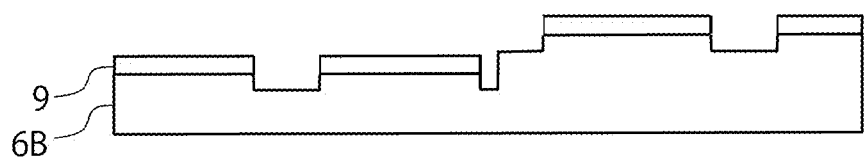
FIG. 17D is a sectional view illustrating the manufacturing method of a template according to the embodiment, in continuation from FIG. 17C.
Figure 17E:
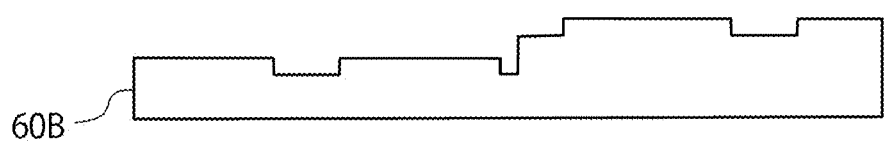
FIG. 17E is a sectional view illustrating the manufacturing method of a template according to the embodiment, in continuation from FIG. 17D.

At the time of drawing a pattern on the substrate 6 to form a master plate (a photomask or a template), the resist film 9 is formed on the substrate 6. In FIG. 16A, the resist film 9 is formed on the mask blank 6A as an example of the substrate 6. In FIG. 17A, the resist film 9 is formed on the template blank 6B as an example of the substrate 6. The substrate 6 having the resist film 9 formed thereon is irradiated with the electron beam EB to draw a pattern on the resist film 9. The electron beam EB irradiated to the substrate 6 backscatters in the substrate 6. The resist film 9 on the substrate 6 is exposed again to the backscattered beam generated by the backscattering. The proximity effect in which the dimension of the pattern changes from the design value is produced due to re-exposure of the resist film 9. Specifically, at a place where the pattern density is high, the amount of re-exposure of the resist film 9 due to backscattering from the peripheral part is large and therefore the dimension of the pattern becomes larger than the design value. On the other hand, at a place where the pattern density is low, the amount of re-exposure is small and the dimension of the pattern becomes smaller than the design value. The proximity effect needs to be corrected to ensure the dimension accuracy of the pattern. In correcting the proximity effect, the amount of irradiation of the electron beam EB is controlled on the basis of an energy distribution of the backscattered beam. A Gaussian distribution is often used as the energy distribution of the backscattered beam. However, when a pattern is drawn on the substrate 6 including a level difference or a slope on the surface as the substrates 6A to 6C illustrated in FIGS. 2A to 2C, the energy distribution of the backscattered beam is not uniform. That is, the energy distribution of the backscattered beam differs among flat portions, slope portions, and a boundary portion between adjacent flat portions. In this case, the proximity effect cannot be appropriately corrected if the Gaussian distribution is always used as the energy distribution of the backscattered beam. In contrast thereto, the drawing apparatus 1 according to the embodiment is configured to appropriately correct the proximity effect irrespective of the surface profile of the substrate 6.

Specifically, drawing data 7 is input to the computer 2 as illustrated in FIGS. 1A and 1B. The drawing data 7 is data for drawing a pattern on the substrate 6 with irradiation of the electron beam EB. The drawing data 7 is, for example, data created by a computer different from the computer 2 on the basis of design data of the master plate. As illustrated in FIGS. 1A and 1B, surface profile data 8 is input to the computer 2. The surface profile data 8 is data related to the surface profile of the substrate 6. The surface profile data 8 is, for example, data created by a computer different from the computer 2 on the basis of the design data of the master plate. The method of inputting the drawing data 7 and the surface profile data 8 to the computer 2 is not particularly limited and can be, for example, input through data communication or input through a storage medium. More details of the drawing data 7 and the surface profile data 8 are explained in an embodiment of a proximity effect correcting method, which will be described later.

The computer 2 calculates an energy distribution of a backscattered beam to be produced by backscattering of the electron beam EB in the substrate 6 on the basis of the drawing data 7 and the surface profile data 8 acquired through the inputting. The computer 2 calculates a required energy amount of the electron beam EB to be irradiated to the substrate 6 on the basis of the calculated energy distribution. The required energy amount is an energy amount of the electron beam EB required to appropriately correct the proximity effect irrespective of the surface profile of the substrate 6. The computer 2 outputs data indicating the calculated required energy amount to the control device 3. An example of the calculation of the required energy amount by the computer 2 is explained in the embodiment of the proximity effect correcting method described later.

The control device 3 controls the irradiation amount of the electron beam EB to be irradiated onto the substrate 6 on the basis of the data indicating the required energy amount (that is, the calculated required energy amount) and input from the computer 2. That is, the control device 3 adjusts the irradiation amount of the electron beam EB to supply the required energy amount of energy of the electron beam EB to the resist film 9 on the substrate 6.

The electron irradiation unit 4 irradiates the substrate 6 with the electron beam EB of the irradiation amount controlled by the control device 3 to draw a pattern on the resist film 9 on the substrate 6. The electron irradiation unit 4 includes, for example, an electron gun that emits the electron beam EB, and an electron optical system (a deflector, an electromagnetic lens, or the like) that controls the trajectory of the emitted electron beam EB.

If the energy distribution of the backscattered beam calculated only on the basis of the drawing data 7 and the required energy amount based on this energy distribution are used, there are cases in which the proximity effect cannot be appropriately corrected when the surface of the substrate 6 includes a level difference or a slope. This is because the drawing data 7 does not include information on the surface profile of the substrate 6, such as the level difference or the slope, and therefore the surface profile of the substrate 6 cannot be considered in the energy distribution of the backscattered beam based on only the drawing data 7. In contrast thereto, the drawing apparatus 1 according to the embodiment uses the energy distribution of the backscattered beam calculated considering both the drawing data 7 and the surface profile data and the required energy amount based on this energy distribution, so that the proximity effect can be appropriately corrected irrespective of the surface profile of the substrate 6.

(Proximity Effect Correcting Method)

Figure 3:
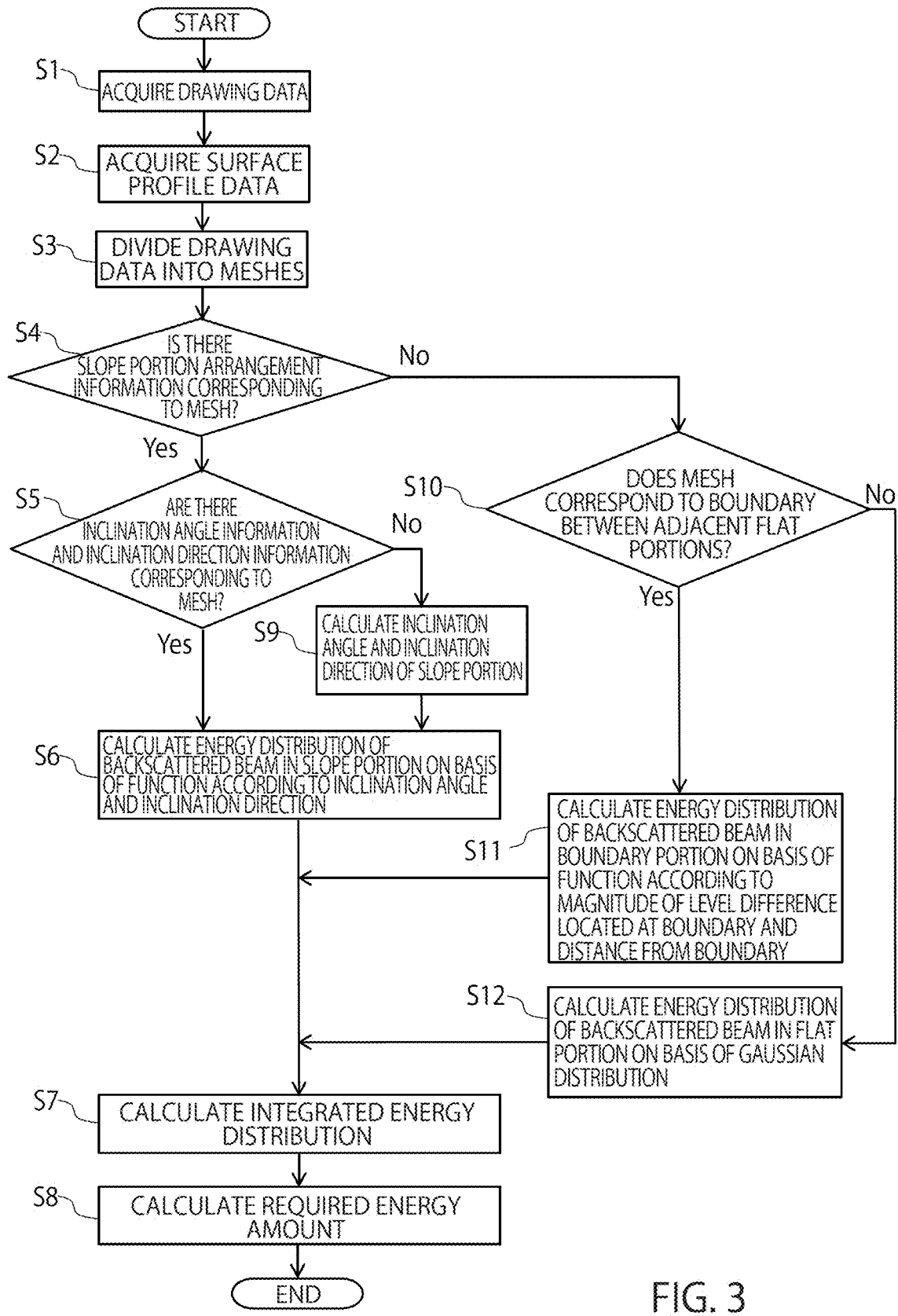
FIG. 3 is a flowchart illustrating an example of a proximity effect correcting method according to the embodiment.

An embodiment of the proximity effect correcting method to which the drawing apparatus 1 according to the embodiment is applied is explained below. FIG. 3 is a flowchart illustrating an example of the proximity effect correcting method according to the embodiment.

Figure 4:
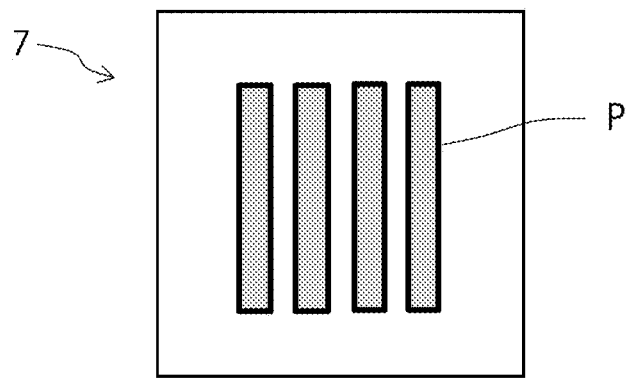
FIG. 4 is an explanatory diagram for explaining an example of an acquiring process of drawing data illustrated in the flowchart of FIG. 3.

As illustrated in FIG. 3, the computer 2 first acquires the drawing data 7 (Step S1). FIG. 4 is an explanatory diagram for explaining an example of an acquiring process of the drawing data 7 illustrated in the flowchart of FIG. 3. As illustrated in FIG. 4, the drawing data 7 indicates a two-dimensional region corresponding to the surface of the substrate 6 and has a pattern P defined in the region. The pattern P on the drawing data 7 is drawn at a corresponding location (that is, coordinates) on the surface of the substrate 6. Since the drawing data 7 is two-dimensional data, the drawing data 7 does not include height direction information, such as a level difference or a slope on the surface of the substrate 6.

Figure 5:
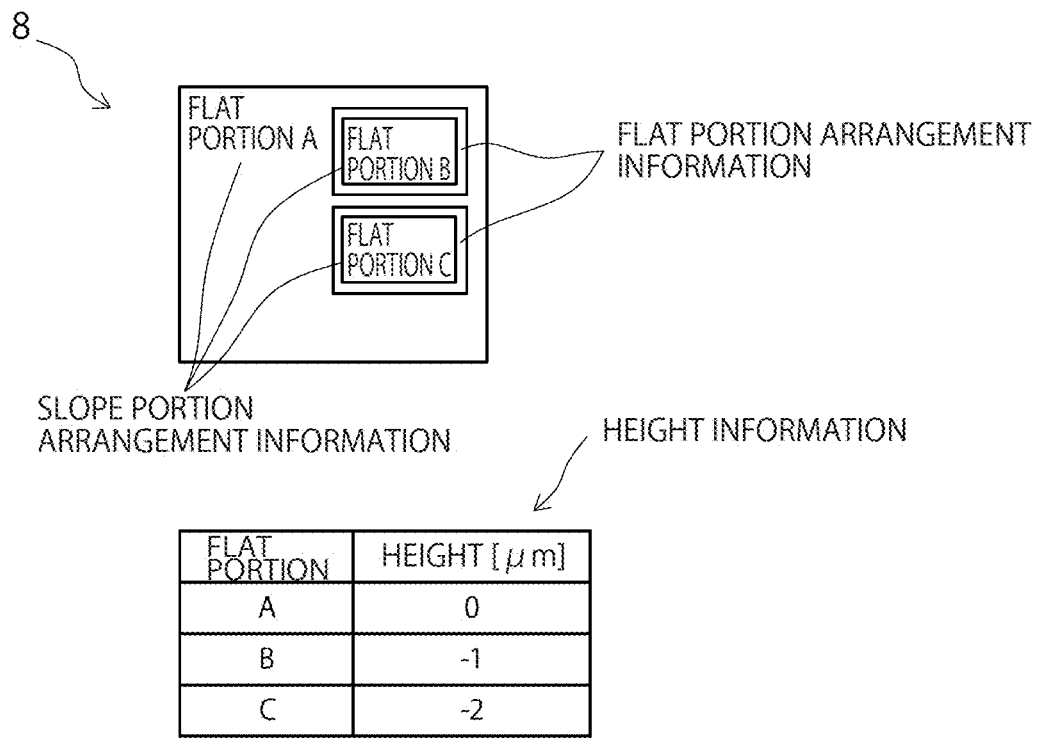
FIG. 5 is an explanatory diagram for explaining an example of an acquiring process of surface profile data illustrated in the flowchart of FIG. 3.

As illustrated in FIG. 3, the computer 2 also acquires the surface profile data 8 (Step S2). The surface profile data 8 is data related to heights of the substrate 6 having different heights with respect to the irradiation direction of the electron beam EB. The irradiation direction of the electron beam EB is a direction orthogonal to the in-plane direction d1 of the substrate 6 and is a direction indicated by an arrow EB (that is, a downward direction) in examples illustrated in FIGS. 1A, 1B, 8, 14, 16B, and 17B. The acquisition of the surface profile data 8 may be performed before the acquisition of the drawing data 7 or may be performed at the same time as the acquisition of the drawing data 7. FIG. 5 is an explanatory diagram for explaining an example of an acquiring process of the surface profile data 8 illustrated in the flowchart of FIG. 3. As illustrated in FIG. 5, the surface profile data 8 includes at least flat portion arrangement information and height information. The flat portion arrangement information is information indicating arrangement states (for example, locations) of a plurality of flat portions arranged on the surface of the substrate 6 so as to have different heights due to level differences, respectively. More specifically, the flat portion arrangement information indicates a two-dimensional region corresponding to the drawing data and has the flat portions defined in the region. The height information is information indicating the heights of the flat portions. The height information is information indicating relative heights with respect to one of the flat portions. As illustrated in FIG. 5, the surface profile data 8 may further include slope portion arrangement information described later. The surface profile data 8 may be data in a table format.

Figure 6:
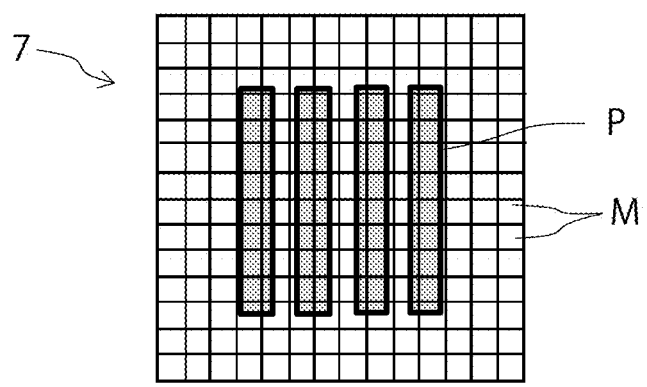
FIG. 6 is an explanatory diagram for explaining an example of a process of dividing the drawing data into meshes illustrated in the flowchart of FIG. 3.

After acquiring the drawing data 7 and the surface profile data 8, the computer 2 divides the drawing data 7 into a plurality of meshes as illustrated in FIG. 3 (Step S3). The meshes are data obtained by dividing the drawing data 7 to correspond to a plurality of regions on the surface of the substrate 6, respectively. FIG. 6 is an explanatory diagram for explaining an example of a process of dividing the drawing data into meshes illustrated in the flowchart of FIG. 3. More specifically, meshes M are data obtained by dividing the drawing data 7 in a net-like manner as illustrated in FIG. 6. Each of the meshes M is used for drawing on the corresponding region on the surface of the substrate 6.

After dividing the drawing data 7 into the meshes M, the computer 2 determines with respect to each of the meshes M whether slope portion arrangement information corresponding to the mesh M is present as the surface profile data 8 as illustrated in FIG. 3 (Step S4). The slope portion arrangement information is information indicating arrangement states (for example, locations) of slope portions as illustrated in FIG. 5.

Figure 7:
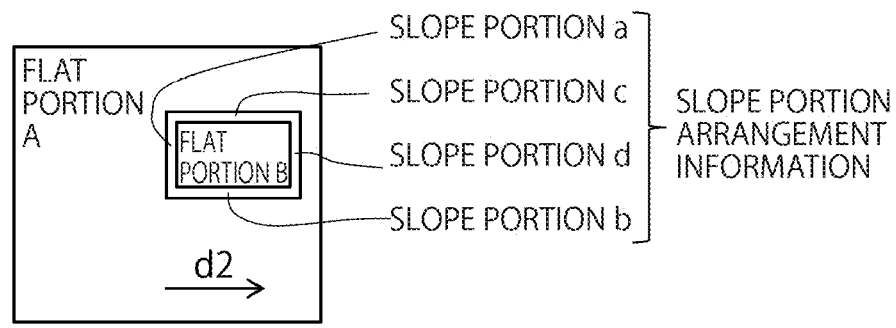
FIG. 7 is an explanatory diagram for explaining an example of inclination angle information and inclination direction information illustrated in the flowchart of FIG. 3.
Figure 7:
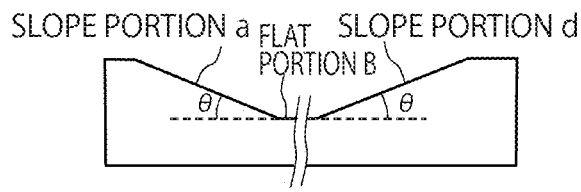

When the slope portion arrangement information corresponding to the mesh M is present (YES at Step S4), the computer 2 determines whether inclination angle information and inclination direction information corresponding to the mesh M are present as the surface profile data 8 as illustrated in FIG. 3 (Step S5). FIG. 7 is an explanatory diagram for explaining an example of the inclination angle information and the inclination direction information illustrated in the flowchart of FIG. 3. The inclination angle information is information indicating an inclination angle θ of each of the slope portions as illustrated in FIG. 7. The inclination direction information is information indicating the direction of each of the slope portions. More specifically, in the example illustrated in FIG. 7, the inclination direction information is information representing a direction on two dimensions in which the height of each of the slope portions decreases, using an angle formed with a reference direction d2 on the two dimensions. For example, since the direction of a slope portion "a" illustrated in FIG. 7 on the two dimensions in which the height of the slope portion "a" decreases corresponds to the reference direction d2, the inclination direction is zero [degrees]. Meanwhile, since the direction of a slope portion "d" illustrated in FIG. 7 on the two dimensions in which the height of the slope portion "d" decreases is opposite to the reference direction d2, the inclination direction is 180 [degrees].

When the inclination angle information and the inclination direction information corresponding to the mesh M (YES at Step S5) are present, the computer 2 acquires the inclination angle from the inclination angle information and acquires the inclination direction from the inclination direction information. The computer 2 then calculates an energy distribution of the backscattered beam in the slope portion on the basis of a function according to the inclination angle and the inclination direction as illustrated in FIG. 3 (Step S6).

Figure 8:
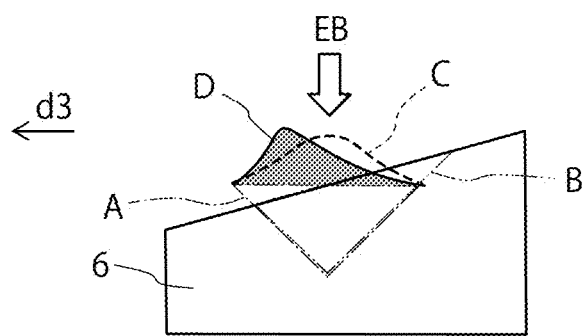
FIG. 8 is an explanatory diagram for explaining an example of a calculating process of an energy distribution of a backscattered beam in a slope portion illustrated in the flowchart of FIG. 3.
Figure 8:
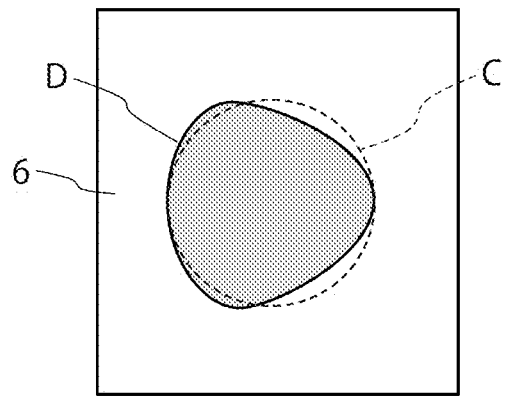

FIG. 8 is an explanatory diagram for explaining an example of a calculating process of an energy distribution of the backscattered beam in a slope portion illustrated in the flowchart of FIG. 3. A region B in which one shot of the electron beam EB irradiated to a slope portion backscatters in the substrate 6, and an energy distribution D of the backscattered beam produced by the backscattering are illustrated in a sectional view and a plan view in FIG. 8. A region A in which one shot of the electron beam EB irradiated to a flat portion backscatters in the substrate 6 and an energy distribution C of the backscattered beam produced by the backscattering are also illustrated in FIG. 8 for a comparison with the slope portion. In the example illustrated in FIG. 8, the energy distribution C of the backscattered beam in the flat portion is a Gaussian distribution. In contrast thereto, the energy distribution D of the backscattered beam in the slope portion is calculated as a distribution different from the Gaussian distribution C as illustrated in FIG. 8. More specifically, the energy distribution D of the backscattered beam in the slope portion is calculated as a distribution in which the peak of the energy amount is shifted toward an inclination direction d3 of the slope portion from the Gaussian distribution C in the example illustrated in FIG. 8.

Figure 9:
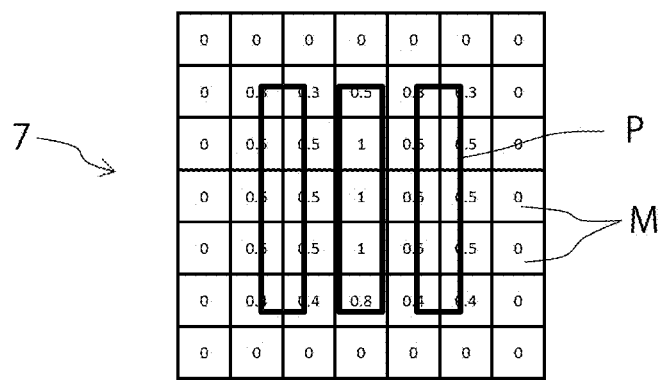
FIG. 9 is an explanatory diagram for explaining the example of the calculating process of the energy distribution of the backscattered beam in the slope portion in more detail than in FIG. 8.

FIG. 9 is an explanatory diagram for explaining the example of the calculating process of the energy distribution of the backscattered beam in the slope portion in more detail than in FIG. 8. The drawing data 7 illustrated in FIG. 9 is partial data corresponding to the slope portion in the drawing data 7 illustrated in FIGS. 4 and 6. In the calculating process of the energy distribution (Step S6), the computer 2 first calculates a pattern area ratio in each of meshes M corresponding to the slope portion as illustrated in FIG. 9 (Step S61). The pattern area ratio is a numerical value that is not less than 0 and not more than 1 and that indicates the ratio of the area of the pattern P with respect to the area of the mesh M for each of the meshes M. As illustrated in FIG. 9, the pattern area ratio is larger in meshes M where the pattern P occupies a larger region.

Figure 10:
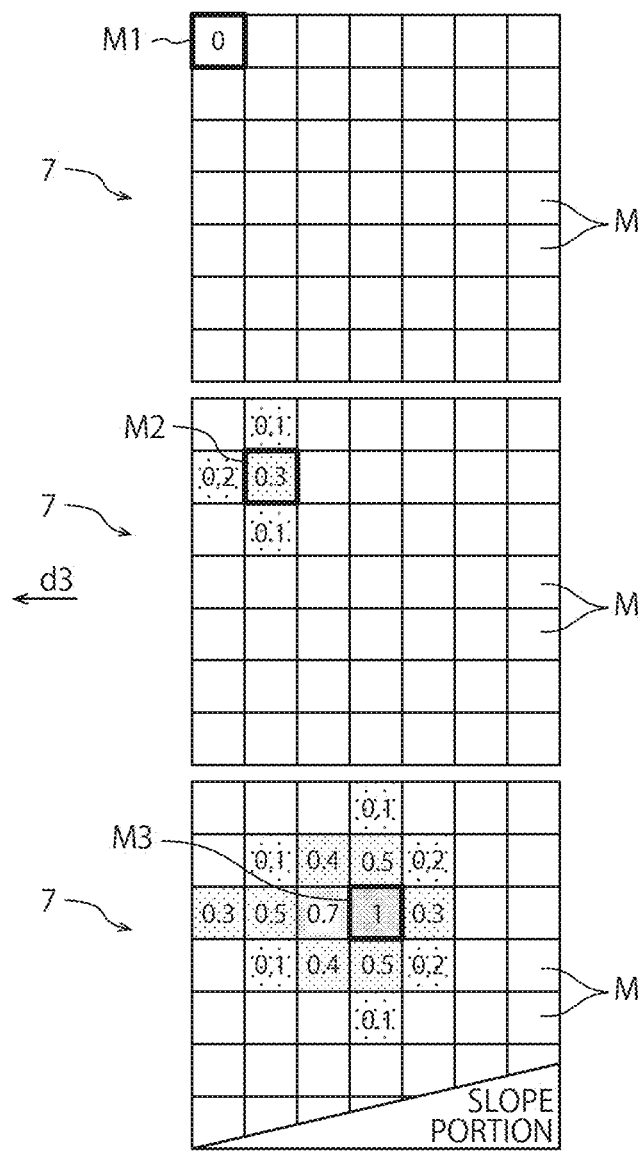
FIG. 10 is an explanatory diagram for explaining an example of the calculating process of the energy distribution of the backscattered beam in the slope portion, in continuation from FIG. 9.

FIG. 10 is an explanatory diagram for explaining an example of the calculating process of the energy distribution of the backscattered beam in the slope portion, in continuation from FIG. 9. After calculating the pattern area ratio, the computer 2 calculates the energy distribution of the backscattered beam in each of the meshes M corresponding to the slope portion as illustrated in FIG. 10 (Step S62). In other words, the computer 2 calculates an energy distribution of the backscattered beam to be produced when the electron beam EB according to the pattern P included in each of the meshes M is irradiated to a region on the slope portion corresponding to each of the meshes M. The calculation of the energy distribution of the backscattered beam in each of the meshes M follows, for example, a function obtained on the basis of a Monte Carlo simulation of the energy distribution of the backscattered beam targeted at the slope portion or a function approximating (that is, simplifying) the obtained function. The calculation of the energy distribution of the backscattered beam in each of the meshes M may be performed on the basis of a table indicating the energy amount of each of the meshes M obtained on the basis of an experimental result.

FIG. 10 illustrates an energy distribution of the backscattered beam to be produced by the electron beam EB to be irradiated to a region on the slope portion corresponding to each of targeted meshes M1 to M3 according to the pattern P included in each of the meshes M1 to M3. Numerical values written in the meshes M1 to M3 and M in FIG. 10 indicate energy amounts of the backscattered beam corresponding to the meshes M1 to M3 and M, respectively. More specifically, the energy amounts written in the meshes M1 to M3 and M in FIG. 10 are values relative to the maximum value converted into 1. In FIG. 10, the energy amounts of the targeted meshes M1 to M3 match the pattern area ratios (see FIG. 9) corresponding to the meshes M1 to M3, respectively. In FIG. 10, each of the meshes M1 to M3 and M is dotted at a density approximately corresponding to the magnitude of the energy amount of the backscattered beam. Further, the slope portion is schematically illustrated in FIG. 10 to represent the heights of the regions on the slope portion corresponding to each of the meshes M1 to M3 and M. As illustrated in FIG. 10, the energy amount is zero in the mesh M1 that does not include the pattern P, that is, where the pattern area ratio is zero and that is away from the meshes M2 and M3 including the pattern P. This is because the mesh M1 not only causes no backscattering due to the electron beam EB to be irradiated according to the pattern P on its own but also is not influenced by the backscattering due to the electron beam EB to be irradiated according to the pattern P in other meshes. Meanwhile, in the mesh M2 where the pattern area ratio is 0.3, an energy distribution on the mesh M2 and surrounding meshes M is calculated based on the backscattered beam to be produced by the electron beam EB to be eradicated according to the pattern P included in the mesh M2. This is because the backscattering of the electron beam EB according to the pattern P on the mesh M2 has an impact not only on the mesh M2 but also on the surrounding meshes M. In the mesh M3 where the pattern area ratio is the maximum value 1, an energy distribution of the meshes M3 and M in a wider range is calculated based on the backscattered beam to be produced by the electron beam EB to be irradiated according to the pattern P included in the mesh M3. As illustrated in FIG. 10, the energy distribution of the backscattered beam in the slope portion is a distribution that is not an isotropic distribution around the targeted meshes M2 and M3 but a distribution having an anisotropic property unevenly distributed toward the inclination direction d3 of the slope portion.

Figures 11, 12:
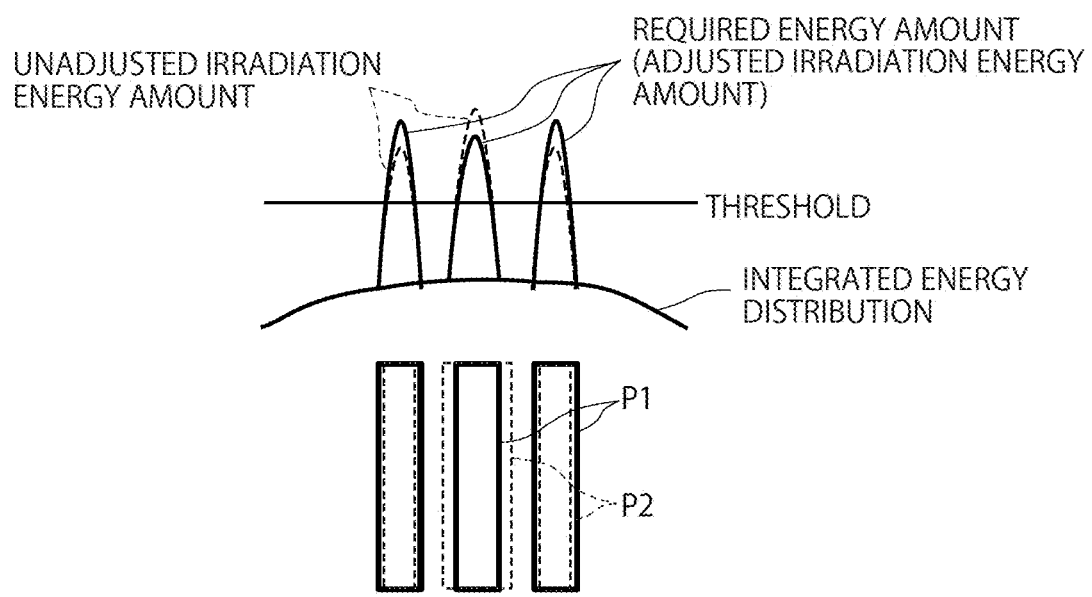
FIG. 11 is an explanatory diagram for explaining an example of a calculating process of an integrated energy distribution in the slope portion illustrated in the flowchart of FIG. 3.
FIG. 12 is an explanatory diagram for explaining an example of a calculating process of a required energy amount illustrated in the flowchart of FIG. 3.

After calculating the energy distribution of the backscattered beam in the slope portion, the computer 2 calculates an integrated energy distribution as illustrated in FIG. 3 (Step S7). The integrated energy distribution is a distribution obtained by integrating the calculated energy distributions of the meshes. FIG. 11 is an explanatory diagram for explaining an example of a calculating process of the integrated energy distribution in the slope portion illustrated in the flowchart of FIG. 3. The integrated energy distribution illustrated in FIG. 11 is calculated from the drawing data 7 illustrated in FIGS. 9 and 10. However, the integrated energy amount written in each of the meshes in FIG. 11 is a value relative to the maximum value converted into 1.

After calculating the integrated energy distribution, the computer 2 calculates a required energy amount on the basis of the calculated integrated energy distribution as illustrated in FIG. 3 (Step S8). FIG. 12 is an explanatory diagram for explaining an example of a calculating process of the required energy amount illustrated in the flowchart of FIG. 3. In FIG. 12, a required energy amount (μC) in the slope portion for each shot is calculated. For sake of explanations, patterns P1 corresponding to a required energy amount for each shot are illustrated in FIG. 12. The resist film 9 on the substrate 6 on which the patterns P1 are drawn is exposed not only to the electron beam EB but also to the backscattered beam. That is, not only the irradiation energy of the electron beam EB but also energy of the backscattered beam is added to the resist film 9. Therefore, the required energy amount is required to be calculated in consideration of the energy amount of the backscattered beam. Accordingly, the computer 2 first defines an irradiation energy amount of the electron beam EB for each shot, to which the integrated energy amount according to the integrated energy distribution is added as illustrated in FIG. 12. The defined irradiation energy amount is an unadjusted irradiation energy amount to which an adjustment for the proximity effect correction has not been performed yet.

Next, the computer 2 sets an energy amount at a predetermined ratio (for example, 50%) to the maximum value of the unadjusted irradiation energy amount as a threshold. The computer 2 then adjusts the irradiation emery amount for each shot in such a manner that distribution widths (lateral widths in FIG. 12) of the irradiation energy amount of the shots are equalized at the threshold. The adjusted irradiation energy amount is calculated as the required energy amount. The calculated required energy amount is used by the control device 3 to adjust the irradiation amount of the electron beam EB. The proximity effect is corrected in this way. If the proximity effect is not corrected, a plurality of patterns P2 having an equal width on the design data and being adjacent to each other are drawn as patterns having different widths, as indicated by the patterns P2 represented by broken line portions in FIG. 12. On the other hand, when the proximity effect is corrected according to the embodiment, a plurality of patterns P1 having an equal width on the design data and being adjacent to each other can be appropriately drawn as the patterns P1 having the same width, as indicated by the patterns P1 represented by solid line portions in FIG. 12.

The computer 2 may recalculate the energy distribution of the backscattered beam using the irradiation amount of the electron beam EB adjusted on the basis of the required energy amount. In this case, the computer 2 may recalculate the integrated energy distribution on the basis of the recalculated energy distribution of the backscattered beam and recalculate the required energy amount of each shot on the basis of the recalculated integrated energy distribution. The recalculation of the required energy amount may be repeated as required.

Figure 13:
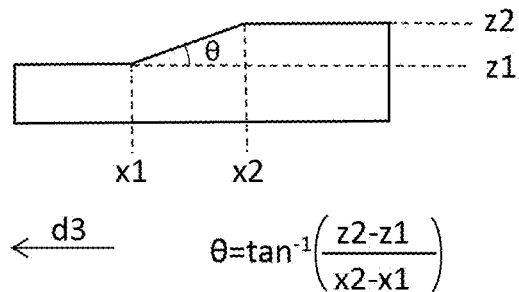
FIG. 13 is an explanatory diagram for explaining an example of a calculating process of an inclination angle and an inclination direction of the slope portion illustrated in the flowchart of FIG. 3.

When the inclination angle information and the inclination direction information corresponding to the mesh M are not present (NO at Step S5), the computer 2 calculates the inclination angle and the inclination direction of the slope portion as illustrated in FIG. 3 (Step S9). FIG. 13 is an explanatory diagram for explaining an example of a calculating process of the inclination angle and the inclination direction of the slope portion illustrated in the flowchart of FIG. 3. The inclination angle and the inclination direction of the slope portion may be calculated, for example, using a linear function or a polynomial based on the slope portion arrangement information and the height information. For example, the inclination angle θ and the inclination direction d3 may be calculated on the basis of the X coordinate (x1) and the Z coordinate (z1) of a lower end of the slope portion, and the X coordinate (x2) and the Z coordinate (z2) of an upper end of the slope portion indicated by the slope portion arrangement information and the height information as illustrated in FIG. 13. In the example illustrated in FIG. 13, the inclination angle θ is the arctangent ($\tan^{-1}$) of the slope $(z2-z1)/(x2-x1)$ of a linear function connecting the coordinates of two points of the lower end (x1, z1) of the slope portion and the upper end (x2, z2) thereof. In the example illustrated in FIG. 13, the inclination direction d3 is a direction from x2 toward x1, in which the Z value of the linear function decreases. After Step S9, the processing proceeds to Step S6.

When the slope portion arrangement information corresponding to the mesh M is not present (NO at Step S4), the computer 2 determines whether the mesh corresponds to a boundary between flat portions that are adjacent without a slope portion interposed therebetween as illustrated in FIG. 3 (Step S10). When the mesh corresponds to the boundary between flat portions (YES at Step S10), the computer 2 calculates an energy distribution of the backscattered beam in the boundary portion between the flat portions on the basis of a function according to the magnitude of a level difference located at the boundary and the distance from the boundary (Step S11).

Figure 14:
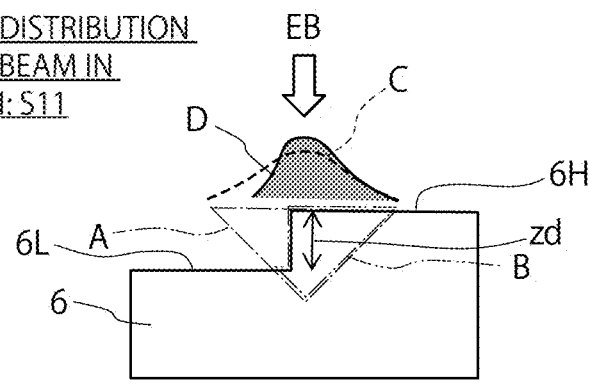
FIG. 14 is an explanatory diagram for explaining an example of a calculating process of the energy distribution of the backscattered beam in a boundary portion between flat portions illustrated in the flowchart of FIG. 3.
Figure 14:
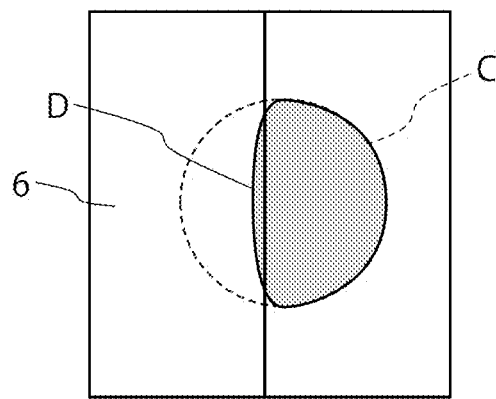

FIG. 14 is an explanatory diagram for explaining an example of a calculating process of the energy distribution of the backscattered beam in a boundary portion between flat portions illustrated in the flowchart of FIG. 3. In FIG. 14, a region B in which one shot of the electron beam EB irradiated to a boundary portion between flat portions 6L and 6H backscatters in the substrate 6, and an energy distribution D of the backscattered beam produced by the backscattering are illustrated in a sectional view and a plan view. FIG. 14 also illustrated a region A in which one shot of the electron beam EB irradiated to a completely flat portion including no level differences backscatters in the substrate 6, and an energy distribution C of the backscattered beam produced by the backscattering, for a comparison with the boundary portion between the flat portions 6L and 6H. In the example illustrated in FIG. 14, the energy distribution C of the backscattered beam in the completely flat portion is a Gaussian distribution. In contrast thereto, the energy distribution D of the backscattered beam in the boundary portion between the flat portions 6L and 6H is calculated as a distribution different from the Gaussian distribution C as illustrated in FIG. 14. More specifically, in the example illustrated in FIG. 14, the energy distribution D of the backscattered beam in the boundary portion between the flat portions 6L and 6H is calculated as a distribution in which the energy amount is concentrated on the side of the flat portion 6H that is higher in the level relative to the Gaussian distribution C. FIG. 14 illustrates an example in which the electron beam EB is irradiated to position the beam center on the flat portion 6H that is higher in the level. When the electron beam EB is irradiated to position the beam center on the flat portion 6L that is lower in the level, an energy distribution in which the energy amount is concentrated on the side of the flat portion 6L that is lower in the level is calculated, unlike FIG. 14.

The calculation of the energy distribution of the backscattered beam in the boundary portion between the flat portions 6L and 6H is performed for each of the meshes M similarly in the examples illustrated in FIGS. 9 and 10. The calculation of the energy distribution of the backscattered beam in each mesh M is, for example, based on a function according to the magnitude of the level difference zd located at the boundary between the flat portion 6L and 6H and the distance in a two-dimensional direction from the boundary. More specifically, the calculation of the energy distribution of the backscattered beam in each mesh M may follow a function obtained on the basis of the Monte Carlo simulation targeted at the boundary portion between the flat portions 6L and 6H, or a function approximating (that is, simplifying) the obtained function. Alternatively, the calculation of the energy distribution of the backscattered beam in each mesh M may be performed on the basis of a table indicating the energy amount of each mesh M obtained on the basis of an experimental result. After Step S11, the processing proceeds to Step S7.

When the mesh does not correspond to a boundary between flat portions (NO at Step S10), the computer 2 determines that the mesh corresponds to a completely flat portion including no level difference. In this case, the computer 2 calculates the energy distribution of the backscattered beam in the flat portion on the basis of the Gaussian distribution (Step S12). The energy distribution according to the Gaussian distribution is represented by, for example, the following expression.

$$g(x) = \eta \times D(x') \times (1/\pi\sigma^2) \times \exp\{-(x-x')^2/\sigma^2\}$$

where $g(x)$ is the energy amount, that is, the energy distribution of the backscattered beam at a coordinate x, $\eta$ is a backscattering coefficient, $D(x')$ is the irradiation amount of the electron beam EB at an irradiation coordinate x' of the electron beam EB, and $\sigma$ is the backscattering radius of the backscattered beam.

The calculation of the energy distribution of the backscattered beam in the flat portion according to the Gaussian distribution is performed for each mesh M similarly in the examples illustrated in FIGS. 9 and 10. After Step S12, the processing proceeds to Step S7. FIG. 15 is an explanatory diagram for explaining an example of a calculating process of the integrated energy distribution in the flat portion illustrated in the flowchart of FIG. 3. FIG. 15 illustrates an example of the integrated energy distribution calculated at Step S7 on the basis of the energy distribution of the backscattered beam according to the Gaussian distribution.

The calculation of the energy distribution of the backscattered beam is not limited to the mode illustrated in FIG. 3. For example, the energy distribution may be calculated according to a function based on the Monte Carlo simulation described above or an experimental result in a boundary portion between a flat portion and a slope portion.

With the proximity effect correcting method according to the embodiment, the energy distribution of the backscattered beam can be calculated on the basis of the drawing data 7 and the surface profile data 8, and the required energy amount of the electron beam can be calculated on the basis of the calculated energy distribution. Accordingly, the proximity effect can be appropriately corrected irrespective of the surface profile of the substrate 6.

With the proximity effect correcting method according to the embodiment, the energy distribution of the backscattered beam in each slope portion can be appropriately calculated on the basis of the drawing data 7, the flat portion arrangement information, the height information, and the slope portion arrangement information as the surface profile data 8, the inclination angle of the slope portion, and the inclination direction of the slope portion.

With the proximity effect correcting method according to the embodiment, the required energy amount can be appropriately calculated on the basis of the integrated energy distribution obtained by integrating the energy distribution of the backscattered beam for each mesh.

With the proximity effect correcting method according to the embodiment, an appropriate correction of the proximity effect according to the surface profile of the substrate 6 can be performed by calculating the energy distribution of the backscattered beam by an appropriate calculation method depending on a boundary portion between a slope portion and a flat portion, or a completely flat portion.

(Master Plate Manufacturing Method)

The proximity effect correcting method according to the embodiment explained with reference to FIGS. 3 to 15 can be used for manufacturing of a master plate. An embodiment of a manufacturing method of a photomask, and an embodiment of a manufacturing method of a template are sequentially explained below as master plate manufacturing methods to which the proximity effect correcting method according to the embodiment is applied.

FIG. 16A is a sectional view illustrating a manufacturing method of a photomask according to the embodiment. As illustrated in FIG. 16A, in manufacturing of a photomask, the resist film 9 is first formed on the mask blank 6A explained with reference to FIG. 2A. The formation of the resist film 9 includes coating of the resist film 9 and pre-baking after the coating. In the example illustrated in FIG. 16A, the resist film 9 is a positive film. The resist film 9 may be a negative film.

Figure 16B:
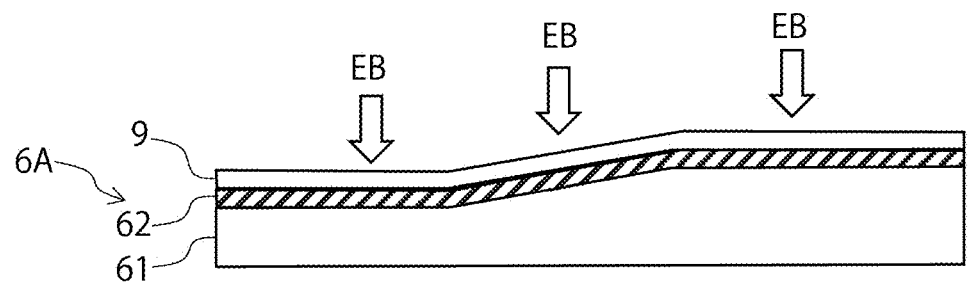
FIG. 16B is a sectional view illustrating the manufacturing method of a photomask according to the embodiment, in continuation from FIG. 16A.

FIG. 16B is a sectional view illustrating the manufacturing method of a photomask according to the embodiment, in continuation from FIG. 16A. After the resist film 9 is formed, the electron beam EB of an irradiation amount adjusted using the proximity effect correcting method according to the embodiment is irradiated by the drawing apparatus 1 as illustrated in FIG. 16B. Accordingly, the resist film 9 at portions to which the electron beam EB is irradiated is exposed to light.

Figure 16C:
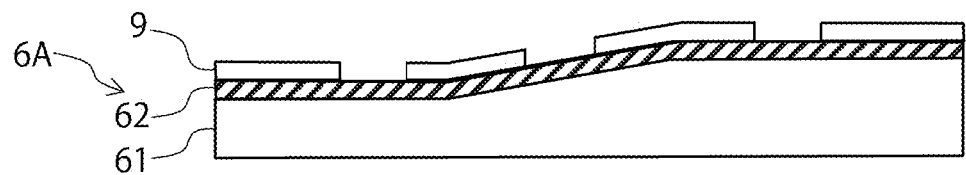
FIG. 16C is a sectional view illustrating the manufacturing method of a photomask according to the embodiment, in continuation from FIG. 16B.

FIG. 16C is a sectional view illustrating the manufacturing method of a photomask according to the embodiment, in continuation from FIG. 16B. After the resist film 9 is exposed to light and the exposed resist film 9 is post-baked, the resist film 9 is developed as illustrated in FIG. 16C. The development of the resist film 9 is performed by a wet process using a chemical. The portions of the resist film 9 exposed to light are removed by the development and the light shielding film 62 is partially exposed at locations where the resist film 9 has been removed.

Figure 16D:
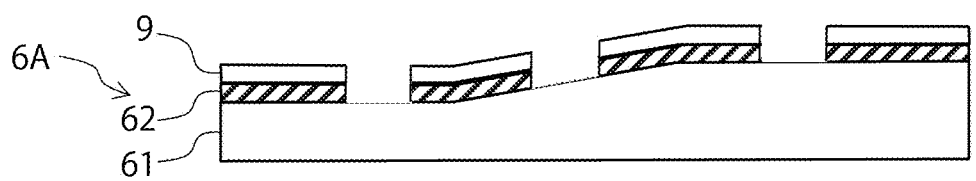
FIG. 16D is a sectional view illustrating the manufacturing method of a photomask according to the embodiment, in continuation from FIG. 16C.

FIG. 16D is a sectional view illustrating the manufacturing method of a photomask according to the embodiment, in continuation from FIG. 16C. After the resist film 9 is developed, the light shielding film 62 is etched (that is, processed) using the developed resist film 9 as a mask. The etching is performed by a dry process.

Figure 16E:
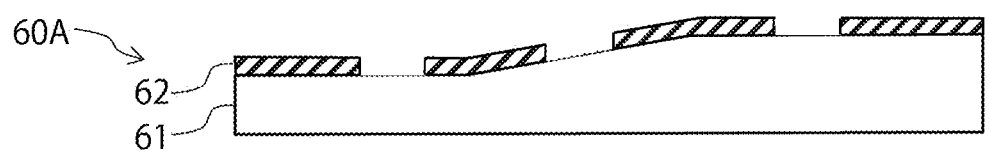
FIG. 16E is a sectional view illustrating the manufacturing method of a photomask according to the embodiment, in continuation from FIG. 16D.

FIG. 16E is a sectional view illustrating the manufacturing method of a photomask according to the embodiment, in continuation from FIG. 16D. After the light shielding film 62 is etched, the resist film 9 is removed as illustrated in FIG. 16E. Accordingly, a photomask 60A is obtained.

FIGS. 17A to 17E are sectional views illustrating a manufacturing method of a template 60B according to the embodiment. As illustrated in FIGS. 17A to 17E, the manufacturing method of the template 60B is basically the same as the manufacturing method of the photomask 60A. The manufacturing method of the template 60B is different from the manufacturing method of the photomask 60A in that a target processed by etching is not the light shielding film 62 but the template blank 6B.

With the manufacturing method of the photomask 60A or the template 60B according to the embodiment, the mask blank 6A or the template blank 6B can be exposed to light using the electron beam EB of an irradiation amount adjusted using the proximity effect correcting method according to the embodiment. Accordingly, the photomask 60A or the template 60B having a pattern with a high dimensional accuracy where the proximity effect has been appropriately corrected irrespective of the surface profile can be obtained. With application of the photomask 60A or the template 60B to a semiconductor process, a pattern of an accurate dimension can be formed on a device substrate having a level difference or a slope on the surface, and a semiconductor device can be appropriately manufactured.

At least a part of the computers 2 illustrated in FIGS. 1A and 1B can be constituted by hardware or software. When it is constituted by software, the computer 2 can be configured such that a program for realizing at least a part of the functions of the computer 2 is stored in a recording medium such as a flexible disk or a CD-ROM, and the program is read and executed by a computer. The recording medium is not limited to a detachable device such as a magnetic disk or an optical disk, and can be a fixed recording medium such as a hard disk device or a memory. Further, a program for realizing at least a part of the functions of the computer 2 can be distributed via a communication line (including wireless communication) such as the Internet. Furthermore, the program can be distributed in an encrypted, modulated, or compressed state via a wired communication line or a wireless communication line such as the Internet, or the program is distributed as it is stored in a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A proximity effect correcting method comprising:
calculating an energy distribution of a backscattered beam to be produced by backscattering of an electron beam in a substrate on a basis of drawing information input from outside and surface profile information of the substrate input from outside; and
calculating a required energy amount of the electron beam on a basis of the calculated energy distribution,
wherein
the drawing information is information for forming a pattern in a resist film on the substrate with irradiation of the electron beam,
the surface profile information is information related to heights of the substrate having different heights in an irradiation direction of the electron beam,
the substrate comprises a first flat portion having a first height, and a second flat portion having a second height,
the surface profile information comprises first arrangement information indicating respective arrangement states of the first flat portion and the second flat portion, and height information indicating respective heights of the first flat portion and the second flat portion, and
the calculating of the energy distribution is based on the drawing information, the first arrangement information, the height information, an inclination angle of each of slope portions arranged on a surface of the substrate, and an inclination direction of each of the slope portions.

2. The method of claim 1, further comprising dividing the drawing information into plural pieces of divided information respectively corresponding to a plurality of regions on a surface of the substrate, wherein
the calculating of the energy distribution is performed for every at least two or more pieces of the divided information, and
the calculating of the required energy amount is performed on a basis of an integrated energy distribution obtained by integrating the calculated energy distribution with respect to the pieces of the divided information.

3. The method of claim 1, further comprising dividing the drawing information into plural pieces of divided information respectively corresponding to a plurality of regions on a surface of the substrate, wherein
the calculating of the energy distribution is performed for each piece of the divided information,
the calculating of the energy distribution is performed in pieces of the divided information corresponding to a region including each of slope portions on the surface of the substrate using a function according to the inclination angle of the associated slope portion, and
the calculating of the required energy amount is performed on a basis of an integrated energy distribution obtained by integrating the calculated energy distribution for each piece of the divided information.

4. The method of claim 1, wherein the drawing information includes pattern information.

5. The method of claim 1, wherein the first height and the second height are different from each other.

6. A proximity effect correcting method, comprising:
calculating an energy distribution of a backscattered beam to be produced by backscattering of an electron beam in a substrate on a basis of drawing information input from outside and surface profile information of the substrate input from outside; and
calculating a required energy amount of the electron beam on a basis of the calculated energy distribution,
wherein
the drawing information is information for forming a pattern in a resist film on the substrate with irradiation of the electron beam,
the surface profile information is information related to heights of the substrate having different heights in an irradiation direction of the electron beam,
the method further comprises dividing the drawing information into plural pieces of divided information respectively corresponding to a plurality of regions on a surface of the substrate,
the calculating of the energy distribution is performed for every at least two or more pieces of the divided information,
the calculating of the energy distribution is performed in pieces of the divided information corresponding to at least one of the regions using a function according to a magnitude of a level difference and a distance,
the calculating of the required energy amount is performed on a basis of an integrated energy distribution obtained by integrating the calculated energy distribution with respect to the pieces of the divided information,
the magnitude of the level difference is a magnitude of a level difference located at a boundary between a plurality of flat portions adjacent on the surface of the substrate, and
the distance is a distance from the boundary to the at least one region.

7. A drawing method comprising:
acquiring drawing information for forming a pattern in a resist film on a substrate with irradiation of an electron beam;
acquiring surface profile information related to heights of the substrate having a plurality of surfaces with the heights different in an irradiation direction of the electron beam;
calculating an energy distribution of a backscattered beam to be produced by backscattering of the electron beam in the substrate on a basis of the acquired drawing information and surface profile information;
calculating a required energy amount of the electron beam on a basis of the calculated energy distribution; and
performing drawing by irradiating the resist film with the electrode beam on a basis of the calculated required energy amount,
wherein
the substrate comprises a first flat portion having a first height, and a second flat portion having a second height,
the surface profile information comprises first arrangement information indicating respective arrangement states of the first flat portion and the second flat portion, and height information indicating respective heights of the first flat portion and the second flat portion, and
the calculating of the energy distribution is based on the drawing information, the first arrangement information, the height information, an inclination angle of each of slope portions arranged on a surface of the substrate, and an inclination direction of each of the slope portions.

8. The method of claim 7, wherein the substrate is a photomask.

9. The method of claim 7, wherein the substrate is a template for nanoimprint lithography.

10. A drawing apparatus comprising:
a stage on which a substrate is mounted;
a drawing part configured to form a pattern in a resist film on the substrate;
a controller configured to control an irradiation amount of an electron beam to be irradiated to the resist film; and
a computer configured to calculate a required energy amount of the electron beam to control the irradiation amount of the electron beam, wherein
the computer calculates the required energy amount on a basis of an energy distribution of a backscattered beam to be produced by backscattering of the electron beam in the substrate; and
the energy distribution of the backscattered beam is based on drawing information for forming the pattern, and surface profile information related to heights of the substrate having a plurality of surfaces with the heights different in an irradiation direction of the electron beam,
wherein
the substrate comprises a first flat portion having a first height, and a second flat portion having a second height,
the surface profile information comprises first arrangement information indicating respective arrangement states of the first flat portion and the second flat portion, and height information indicating respective heights of the first flat portion and the second flat portion, and
the energy distribution is based on the drawing information, the first arrangement information, the height information, an inclination angle of each of slope portions arranged on a surface of the substrate, and an inclination direction of each of the slope portions.

11. A drawing method comprising:
acquiring drawing information for forming a pattern in a resist film on a substrate with irradiation of an electron beam;
acquiring surface profile information related to heights of the substrate having a plurality of surfaces with the heights different in an irradiation direction of the electron beam;

calculating an energy distribution of a backscattered beam to be produced by backscattering of the electron beam in the substrate on a basis of the acquired drawing information and surface profile information;

calculating a required energy amount of the electron beam on a basis of the calculated energy distribution; and performing drawing by irradiating the resist film with the electrode beam on a basis of the calculated required energy amount, wherein the method further comprises dividing the drawing information into plural pieces of divided information respectively corresponding to a plurality of regions on a surface of the substrate, the calculating of the energy distribution is performed for every at least two or more pieces of the divided information, the calculating of the energy distribution is performed in pieces of the divided information corresponding to at least one of the regions using a function according to a magnitude of a level difference and a distance, the calculating of the required energy amount is performed on a basis of an integrated energy distribution obtained by integrating the calculated energy distribution with respect to the pieces of the divided information, the magnitude of the level difference is a magnitude of a level difference located at a boundary between a plurality of flat portions adjacent on the surface of the substrate, and the distance is a distance from the boundary to the at least one region.

12. A drawing apparatus comprising:

a stage on which a substrate is mounted;

a drawing part configured to form a pattern in a resist film on the substrate;

a controller configured to control an irradiation amount of an electron beam to be irradiated to the resist film; and a computer configured to calculate a required energy amount of the electron beam to control the irradiation amount of the electron beam, wherein the computer calculates the required energy amount on a basis of an energy distribution of a backscattered beam to be produced by backscattering of the electron beam in the substrate, the energy distribution of the backscattered beam is based on drawing information for forming the pattern, and surface profile information related to heights of the substrate having a plurality of surfaces with the heights different in an irradiation direction of the electron beam, the computer divides the drawing information into plural pieces of divided information respectively corresponding to a plurality of regions on a surface of the substrate, the computer calculates the energy distribution for every at least two or more pieces of the divided information, the computer calculates the energy distribution in pieces of the divided information corresponding to at least one of the regions using a function according to a magnitude of a level difference and a distance, the computer calculates the required energy amount on a basis of an integrated energy distribution obtained by integrating the calculated energy distribution with respect to the pieces of the divided information, the magnitude of the level difference is a magnitude of a level difference located at a boundary between a plurality of flat portions adjacent on the surface of the substrate, and the distance is a distance from the boundary to the at least one region.

\* \* \* \* \*